US009494663B2

(12) United States Patent
Tsuji et al.

(10) Patent No.: US 9,494,663 B2
(45) Date of Patent: Nov. 15, 2016

(54) NMR SPECTROMETER AND METHOD OF SETTING UP THE SAME

(71) Applicant: JEOL Resonance Inc., Akishima-shi, Tokyo (JP)

(72) Inventors: Shigenori Tsuji, Akishima (JP); Fumio Hobo, Akishima (JP); Ryoji Tanaka, Akishima (JP); Hiroto Suematsu, Akishima (JP)

(73) Assignee: JEOL Ltd., Tokyo (JP)

( * ) Notice: Subject to any disclaimer, the term of this patent is extended or adjusted under 35 U.S.C. 154(b) by 990 days.

(21) Appl. No.: 13/732,582

(22) Filed: Jan. 2, 2013

(65) Prior Publication Data

US 2013/0178367 A1      Jul. 11, 2013

(30) Foreign Application Priority Data

Jan. 6, 2012  (JP) ................. 2012-001237

(51) Int. Cl.
   *G01R 33/34* (2006.01)
(52) U.S. Cl.
   CPC ............... *G01R 33/34023* (2013.01)
(58) Field of Classification Search
   CPC ............ G01R 33/31; G01R 33/34023; G01R 33/3403; G01R 33/46
   USPC .................. 324/307, 309, 318–322; 505/162
   See application file for complete search history.

(56) References Cited

U.S. PATENT DOCUMENTS

| 5,565,778 | A | 10/1996 | Brey et al. | |
|---|---|---|---|---|
| 5,572,127 | A * | 11/1996 | Wong | F25D 19/006 324/315 |
| 5,986,453 | A | 11/1999 | Anderson et al. | |
| 6,054,855 | A * | 4/2000 | Anderson | G01R 33/34053 324/307 |
| 2002/0179830 | A1* | 12/2002 | Pearson | G01R 33/3873 250/250 |
| 2008/0204015 | A1* | 8/2008 | Shiino | G01R 33/307 324/307 |
| 2010/0321018 | A1* | 12/2010 | Takegoshi | G01R 33/3403 324/318 |
| 2012/0105062 | A1* | 5/2012 | Nishihagi | G01R 33/4804 324/318 |

OTHER PUBLICATIONS

Steven M. Anlage, "High Temperature Superconducting Radio Frequency Coils for NMR Spectroscopy and Magnetic Resonance Imaging", "Microwave Superconductivity", ed. by H. Weinstock and M. Nisenoff, Kluwer Academic Publishers (2001), pp. 337-352, Amsterdam.
William W. Brey et al., "Design, construction, and validation of a 1-mm triple-resonance high-temperature-superconducting probe for NMR", Journal of Magnetic Resonance 179 (2006) pp. 290-293.

* cited by examiner

*Primary Examiner* — Melissa Koval
*Assistant Examiner* — Rishi Patel
(74) *Attorney, Agent, or Firm* — The Webb Law Firm

(57) ABSTRACT

An NMR spectrometer and method in the following three steps are performed. (1) An external magnetic field is set to $H_0+\Delta H$ (where $\Delta H>0$). When the detection coil made of the superconducting material is still in a normal state, a magnetic field stronger than the ultimate target static magnetic field strength $H_0$ by $\Delta H$ is applied to the detection coil. (2) The detection coil made of the superconducting material is cooled down to $T_0$ lower than its critical temperature $T_c$ to bring the coil into a superconducting state while the external magnetic field $H_0+\Delta H$ is applied to the detection coil. (3) The external magnetic field is lowered from $H_0+\Delta H$ to $H_0$ such that the applied external magnetic field is decreased by $\Delta H$ while the detection coil is kept in the superconducting state.

9 Claims, 4 Drawing Sheets

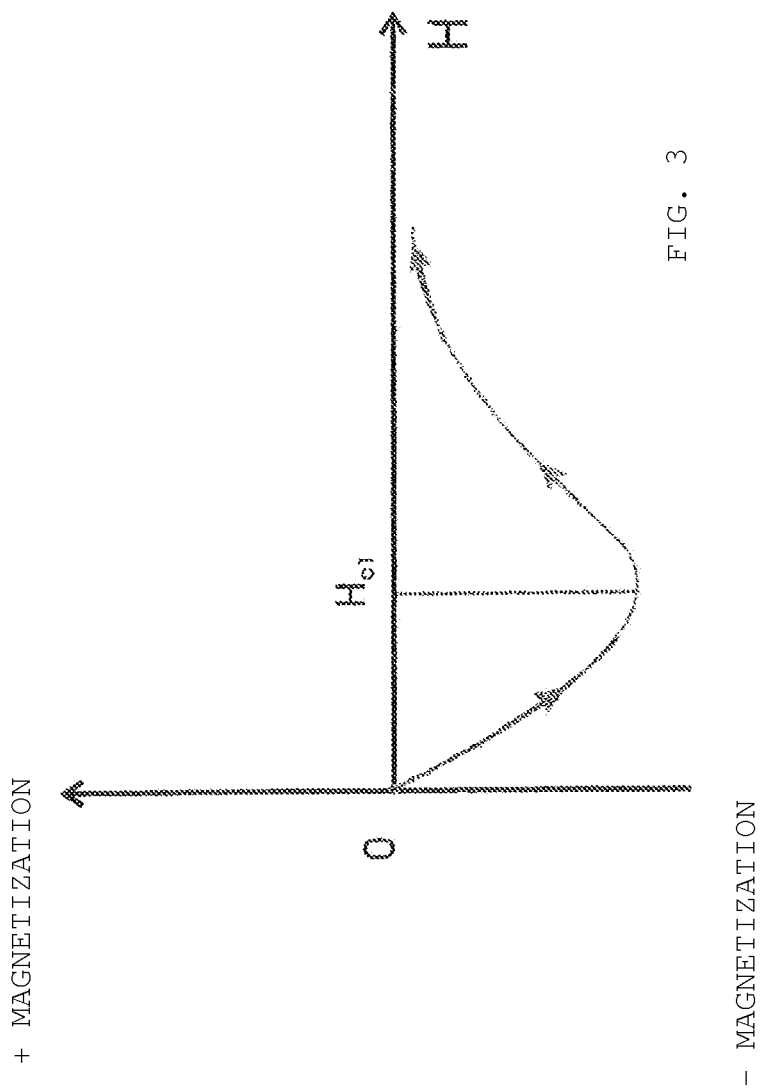

NMR SPECTROMETER AND METHOD OF SETTING UP THE SAME

BACKGROUND OF THE INVENTION

1. Field of the Invention

The present invention relates to a high-sensitivity nuclear magnetic resonance (NMR) spectrometer and also to a method of setting up the spectrometer.

2. Description of Related Art

A nuclear magnetic resonance (NMR) spectrometer is an analytical instrument for detecting signals of atomic nuclei having spin magnetic moments by applying a static magnetic field to these atomic nuclei to induce a Larmor precession in the spin magnetic moments and irradiating the atomic nuclei with RF waves having the same frequency as the Larmor precession so as to produce a resonance.

FIG. 1 is a schematic block diagram of an NMR spectrometer. This instrument includes an RF oscillator 1 producing RF waves which are controlled in phase and pulse width by a phase controller 2 and an amplitude controller 3. The resulting waves are sent as RF pulses to a power amplifier 4.

The RF pulses are amplified by the power amplifier 4 to a power level necessary to excite an NMR signal and then fed to an NMR probe 6 via a duplexer 5. The pulses are then directed at a sample under investigation from a transmit/receive coil (not shown) placed within the NMR probe 6.

After the RF pulse irradiation, a feeble NMR signal emanating from the sample is detected by the transmit/receive coil and sent to a preamplifier 7 via the duplexer 5. Then, the signal is amplified to a signal strength sufficient to be handled by a receiver 8.

The receiver 8 converts the frequency of the RF NMR signal amplified by the preamplifier 7 into an audio frequency that can be converted into digital form. At the same time, the amplitude is controlled. The NMR signal that has been converted into an audio frequency by the receiver 8 is converted into digital form by an analog-to-digital data converter (ADC) 9 and sent to a control computer 10.

The control computer 10 controls both phase controller 2 and amplitude controller 3. The computer also Fourier-transforms the NMR signal accepted in the time domain, phase-corrects the Fourier-transformed NMR signal, and then displays the corrected signal as an NMR spectrum.

An NMR spectrometer accurately detects local magnetic fields produced in nuclei under investigation using a detection coil. The obtained data about the magnetic fields include data about the external magnetic field and information about hyperfine magnetic fields produced from atoms existing in the surroundings. The hyperfine magnetic fields depend on the positions of atoms coordinated in the surroundings and on how the nuclei under investigation are coupled to surrounding atoms. Atomic-level chemical identification of samples and structural analysis of polymers (typified by proteins) are enabled by precisely analyzing the obtained magnetic field data.

In order to extract information about the hyperfine magnetic fields from the magnetic field data, it is important to achieve high-resolution spectra. For this purpose, it is important to achieve high homogeneity of the external magnetic field in the sample space. If the external magnetic field is made inhomogeneous for some reason or other, error occurs in extracting information about the hyperfine magnetic fields from the magnetic field data. One factor giving rise to inhomogeneous magnetic fields is the magnetization of instrument members close to the sample space. Especially, regarding a detection coil for detecting local magnetic fields, a disturbed magnetic field will be produced in the sample space by the coil unless its magnetization is null.

Usually, an NMR spectrometer characterized by high resolution is equipped with a shim coil set for correcting magnetic field distortions in the sample space. Realistically, however, the correction is restricted to low order spherical harmonic component of the magnetic field. Therefore, it is difficult to correct an inhomogeneous magnetic field due to the magnetization of the detection coil having a complex shape. Consequently, with respect to a detection coil having a complex shape and located close to the sample space, it is required that the magnetization of the material of the coil be reduced down to complete zero such that no magnetic field distortion is exerted into the sample space.

On the other hand, in order to enhance the accuracy of chemical identification and crystallographic structure determination, the sensitivity at which signals arising from nuclei under investigation are detected is important as well as resolution, needless to say. For example, if there exist many kinds of nuclei to be investigated having different hyperfine magnetic fields such as polymers, the correct molecular structure would not be derived unless all kinds of nuclei in small relative abundances can be detected.

Electromagnetic radiations detected by NMR spectroscopy lie in the RF range. The electromagnetic energy emitted by a single atom and detected by NMR is much weaker than energies of X-rays and light utilized by other techniques employing electromagnetic radiations. Contrivances (such as cross polarization) have been made to enhance weak signals. At the same time, methods of detecting weak signals at high sensitivity have been heretofore developed vigorously.

The method of detecting electromagnetic waves emanating from nuclei under investigation based on the Faraday's law of electromagnetic induction is a classical and well-known method. In a method using a detection coil based on the Faraday's law of electromagnetic induction, Johnson noises are prevalent among various types of noises according to the fluctuation-dissipation theorem. It is known that the noise level is in proportion to the square root of the temperature of the coil and to the square root of the electric resistance of the coil. Therefore, as mentioned, for example, in "High Temperature Superconducting Radio Frequency Coils for NMR Spectroscopy and Magnetic Resonance Imaging", Steven M. Anlage, "Microwave Superconductivity", ed. by H. Weinstock and M. Nisenoff, (Kluwer, Amsterdam, 2001), pp. 337-352, selecting the coil material from a superconducting material having an electrical resistance capable of being reduced down to substantially zero under cryogenic conditions is currently considered as one of the best methods among methods using detection coils based on the Faraday's law of electromagnetic inductance in enhancing the sensitivity at which NMR signals emanating from nuclei under investigation are detected.

In "Design, construction, and validation of a 1-mm triple-resonance high-temperature-superconducting probe for NMR", William W. Brey et al., Journal of Magnetic Resonance 179 (2006) 290-293", there is a mention of a detection coil which is made of a superconducting material and is promising as a signal detector having high sensitivity characteristics. The configuration and operation described in this document are described below. First, the whole configuration of the apparatus is shown in FIG. 2A. FIG. 2B is a cross section of a central portion of the apparatus.

A superconducting magnet system 21 applies a static magnetic field to a sample. The magnet system 21 is centrally provided with a bore extending vertically through the system along its axis. A cryogenic NMR probe 22 is mounted in this bore and has a sample loading portion around which a static magnetic field shimming system 23 (also referred to as the shim coil set) is disposed coaxially with the NMR probe 22. The shimming system 23 can produce magnetic fields having desired strength distributions in the X, Y, and Z directions in order to correct magnetic field distortions of the static magnetic field in the X, Y, and Z directions, the static magnetic field being applied to the sample. The NMR probe 22 is cooled by a coolant supplied from a probe cooling system 24.

FIG. 2B is a cross section of the cryogenic NMR probe 22, taken along a plane perpendicular to the axis of the static magnetic field $H_0$. The probe 22 has a vacuum insulated pipe 33 in which a sample 32 is loaded. A coil element pair 31-1 for detection of $^1H$ nucleus, a coil element pair 31-2 for detection of $^2H$ nucleus (lock nucleus), a coil element pair 31-3 for detection of $^{13}C$ nucleus, and a coil element pair 31-4 for detection of $^{15}N$ nucleus are arranged in this order from the inside around the sample 32. Each detection coil is made of high temperature superconducting coil. Using high temperature superconducting materials, the coils have been fabricated on a flat substrate made of a ceramic of high thermal conductivity (such as sapphire or aluminum nitride). A pair of such coils constitutes a Helmholtz pair, placed on opposite sides of a sample. Each substrate is mounted to a base 30, which is cooled by the probe cooling system 24, and is held at a low temperature.

The cryogenic NMR probe 22 is characterized in that the detection coil is cooled cryogenically by the cooling capability of the probe cooling system 24 while controlling the sample 32 at a desired temperature by supplying a gas for adjustment of the temperature of the sample through the vacuum insulated pipe 33. This cooling lowers the electrical resistance of the detection coil and raises the Q value of the coil. Concomitantly, the electrical thermal noise drops. Because of their combined effects, it can be expected that the sensitivity at which NMR signals are detected will be enhanced.

Fabricating detection coils from a superconducting material as mentioned in the Anlage article cited herein, is intended to reduce the electrical resistance of the detection coils further and to improve the sensitivity further compared with the case where normal metal materials are used.

In discussing NMR utilization, it is expected that reduced RF surface resistances of superconductors will have the effect of suppressing thermal noise introduced to detection signals. However, a superconductor also has strong magnetic shielding effect concomitant with superconductivity. The superconductor exhibits diamagnetic character to magnetic flux expulsion, so-called the Meissner effect. Consequently, a strong magnetization is produced, disturbing the magnetic field homogeneity across the sample space. As a result, the magnetic field distortion near the detection coil reduces the detection coil filling factor which defines the fraction of the coil volume occupied by the sample. This leads to a deterioration in the signal/noice (S/N) ratio.

Anlage reported the characteristics of an NMR detection coil using a high-temperature superconductor. According to Table 1 of the Anlage article cited herein, a detection coil using a high-temperature superconductor at low temperatures shows Q values that are about 40 times as high as the Q values of detection coils made of normal metals such as copper at room temperature. Generally, the sensitivity at which an NMR signal is detected is in proportion to the square root of the Q value of a detection coil. Therefore, a calculation shows that the latter case provides a factor of about 6.3 improvement in sensitivity.

Table 1 of the Anlage article cited herein shows the filling factor normalized to that of the coil made of a normal metal in a room temperature environment. A coil made of a high-temperature superconductor in a low temperature environment has a filling factor of about 0.2. Generally, the sensitivity is in proportion to the square root of the filling factor. Therefore, in the latter case, the relative sensitivity coefficient is roughly halved to about 0.45.

One mentioned reason why the filling factor is so low is that a coil design using a flat substrate is urged. Another reason mentioned is that the detection coil is urged to be widely spaced from the sample 32 to avoid adverse effects of the magnetic field inhomogeneity because of strong magnetic shielding effect of a superconducting material.

U.S. Pat. Nos. 5,565,778 and 5,986,453 propose designs for achieving high Q-factor by employing a minimum of RF electric field over the sample volume. In these designs, the symmetry around the axis of the sample is enhanced, and slits are appropriately arranged to suppress shield currents becoming a magnetic shielding source due to the Meissner effect. However, it is difficult to take an appropriate countermeasure using slits around the axis of the external magnetic field. Furthermore, a decrease in the magnetic field homogeneity along the axis of the external magnetic field is inevitable.

SUMMARY OF THE INVENTION

In view of the foregoing, it is an object of the present invention to provide an NMR spectrometer adapted for high-sensitivity measurements and providing a high filling factor even if an NMR detection coil made of a superconductor is used in the spectrometer, as well as a method of setting up this NMR spectrometer.

A method associated with the present invention and achieving this object is intended to set up an NMR spectrometer having: a superconducting magnet system for applying a static magnetic field $H_0$ to a sample; an NMR probe for magnetically exciting nuclei under investigation by applying an RF magnetic field to the sample in a direction perpendicular to the magnetic field $H_0$; a detection coil made of a superconducting material, incorporated in the NMR probe, and detecting an NMR signal emanating from the magnetically excited nuclei under investigation; and a cryogenic cooling system for cryogenically cooling the detection coil, enhancing the Q value of the coil, and reducing thermal noise. The method comprises the following steps:

(1) An external magnetic field is set to $H_0+\Delta H$ (where $\Delta H > 0$). When the detection coil made of the superconducting material is still in a normal state, a magnetic field stronger than the ultimate target external magnetic field $H_0$ by $\Delta H$ is applied to the detection coil.

(2) The detection coil made of the superconducting material is cooled down to $T_0$ lower than its critical temperature $T_c$ to bring the coil into a superconducting state while the external magnetic field $H_0+\Delta H$ is applied to the detection coil.

(3) The external magnetic field is lowered from $H_0+\Delta H$ to $H_0$ such that the applied external magnetic field is decreased by $\Delta H$ while the detection coil is kept in the superconducting state.

In one feature of this method, a shim coil set and a power supply for controlling it are used to generate the magnetic field $\Delta H$.

In another feature of this method, the external magnetic field is matched to an optimum value for making the magnetization of the detection coil zero by measuring an NMR signal emanating from a reference standard while varying the magnetic field $\Delta H$ generated by the shim coil set and adjusting shim values of the shim coil set such that the signal is minimized in terms of line width.

In a still other feature of this method, said superconducting material is a type II superconductor.

In a yet other feature of this method, the type II superconductor is one selected from a high-temperature superconductor $YBa_2Cu_3O_7$, a high-temperature superconductor $Bi_2Sr_2CaCu_2O_8$, and a metallic low-temperature superconductor NbTi.

In an additional feature of this method, characteristics of the type II superconductor are controlled by presence of an amorphous non-superconducting columnar defects formed by heavy ion irradiation, normal conducting impurities, or lattice defects.

In a yet additional feature of this method, in order to estimate an optimum value of the magnetic field difference $\Delta H$, a magnetization curve is previously found using a magnetization measuring device and by field cooling (FC) of the superconducting material.

In a still further feature of this method, the magnetization measuring device is a SQUID magnetometer.

An NMR spectrometer associated with the present invention has: a superconducting magnet system for applying a static magnetic field $H_0$ to a sample; an NMR probe for magnetically exciting nuclei under investigation by applying an RF magnetic field to the sample in a direction perpendicular to the static magnetic field $H_0$; a detection coil made of a superconducting material, incorporated in the NMR probe, and detecting an NMR signal emanating from the magnetically excited nuclei under investigation; and a cryogenic cooling system for cryogenically cooling the detection coil, enhancing the Q value of the coil, and reducing thermal noise. Furthermore, the NMR spectrometer has setup means for setting up the spectrometer by the following steps:

(1) An external magnetic field is set to $H_0+\Delta H$ (where $\Delta H>0$). When the detection coil made of the superconducting material is still in a normal state, a magnetic field stronger than the ultimate target static magnetic field $H_0$ by $\Delta H$ is applied to the detection coil.

(2) The detection coil made of the superconducting material is cooled down to $T_0$ lower than its critical temperature $T_c$ to bring the coil into a superconducting state while the external magnetic field $H_0+\Delta H$ is applied to the detection coil.

(3) The external magnetic field is lowered from $H_0+\Delta H$ to $H_0$ such that the applied external magnetic field is decreased by $\Delta H$ while the detection coil is kept in the superconducting state.

The method of the present invention is intended to set up an NMR spectrometer having: a superconducting magnet system for applying a static magnetic field $H_0$ to a sample; an NMR probe for magnetically exciting nuclei under investigation by applying an RF magnetic field to the sample in a direction perpendicular to the magnetic field $H_0$; a detection coil made of a superconducting material, incorporated in the NMR probe, and detecting an NMR signal emanating from the magnetically excited nuclei under investigation; and a cryogenic cooling system for cryogenically cooling the detection coil, enhancing the Q value of the coil, and reducing thermal noise. This method includes the following three steps:

(1) An external magnetic field is set to $H_0+\Delta H$ (where $\Delta H>0$). When the detection coil made of the superconducting material is still in a normal conducting state, a magnetic field stronger than the ultimate target external magnetic field strength $H_0$ by $\Delta H$ is applied to the detection coil.

(2) The detection coil made of the superconducting material is cooled down to $T_0$ lower than its critical temperature $T_c$ to bring the coil into a superconducting state while the external magnetic field $H_0+\Delta H$ is applied to the detection coil.

(3) The external magnetic field is lowered from $H_0+\Delta H$ to $H_0$ such that the applied external magnetic field is decreased by $\Delta H$ while the detection coil is kept in the superconducting state.

Therefore, if the NMR detection coil uses the superconducting material, the NMR spectrometer setup method achieves a high filling factor.

An NMR spectrometer associated with the present invention has: a superconducting magnet system for applying a static magnetic field $H_0$ to a sample; an NMR probe for magnetically exciting nuclei under investigation by applying an RF magnetic field to the sample in a direction perpendicular to the static magnetic field $H_0$; a detection coil made of a superconducting material, incorporated in the NMR probe, and detecting an NMR signal emanating from the magnetically excited nuclei under investigation; and a cryogenic cooling system for cryogenically cooling the detection coil, enhancing the Q value of the coil, and reducing thermal noise. Furthermore, the NMR spectrometer has setup means for setting up the spectrometer by the following three steps:

(1) An external magnetic field is set to $H_0+\Delta H$ (where $\Delta H>0$). When the detection coil made of the superconducting material is still in a normal state, a magnetic field stronger than the ultimate target static magnetic field $H_0$ by $\Delta H$ is applied to the detection coil.

(2) The detection coil made of the superconducting material is cooled down to $T_0$ lower than its critical temperature $T_c$ to bring the coil into a superconducting state while the external magnetic field $H_0+\Delta H$ is applied to the detection coil.

(3) The external magnetic field is lowered from $H_0+\Delta H$ to $H_0$ such that the applied external magnetic field is decreased by $\Delta H$ while the detection coil is kept in the superconducting state.

Therefore, if the NMR detection coil is made of a superconducting material, the NMR spectrometer achieves a high filling factor.

BRIEF DESCRIPTION OF THE DRAWINGS

FIG. 3 is a graph showing one example of a magnetization curve of a type II superconductor.

DESCRIPTION OF THE PREFERRED EMBODIMENTS

Figure 1:
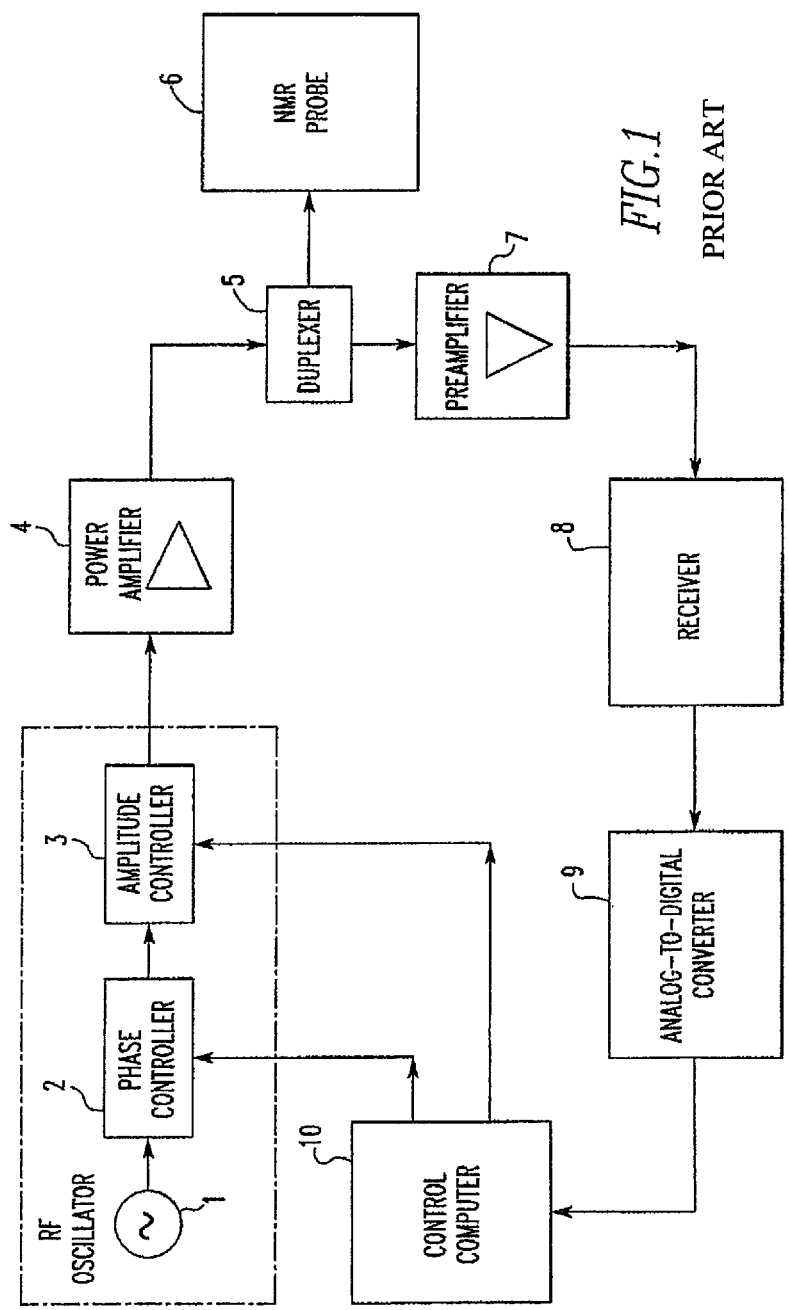
FIG. 1 is a block diagram of a general and conventional NMR spectrometer.
Figure 2A:
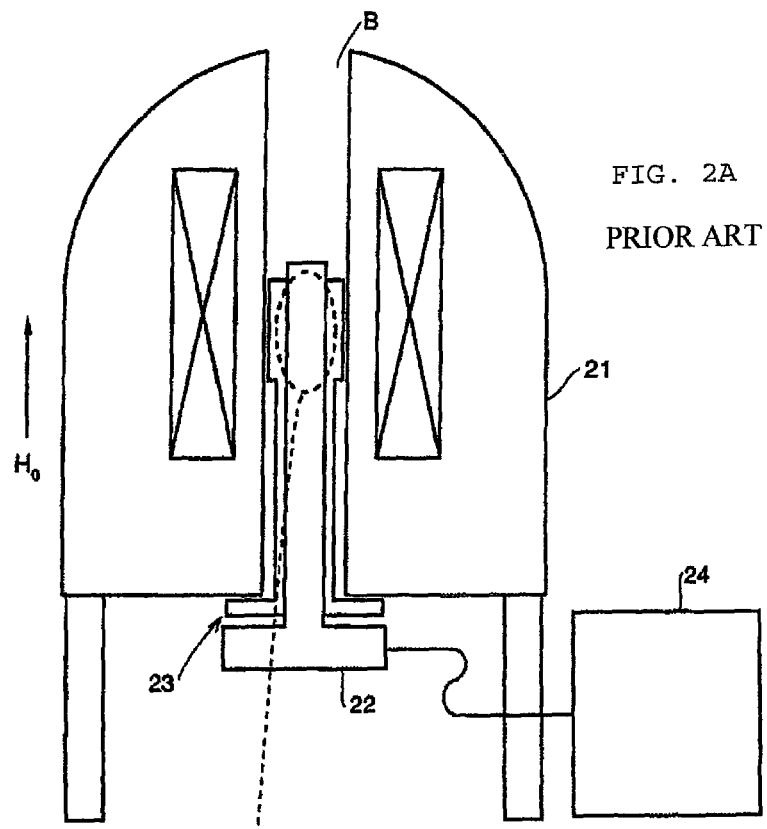
FIGS. 2A and 2B are diagrams showing the configuration of a general and conventional cryogenic NMR probe.
Figure 2B:
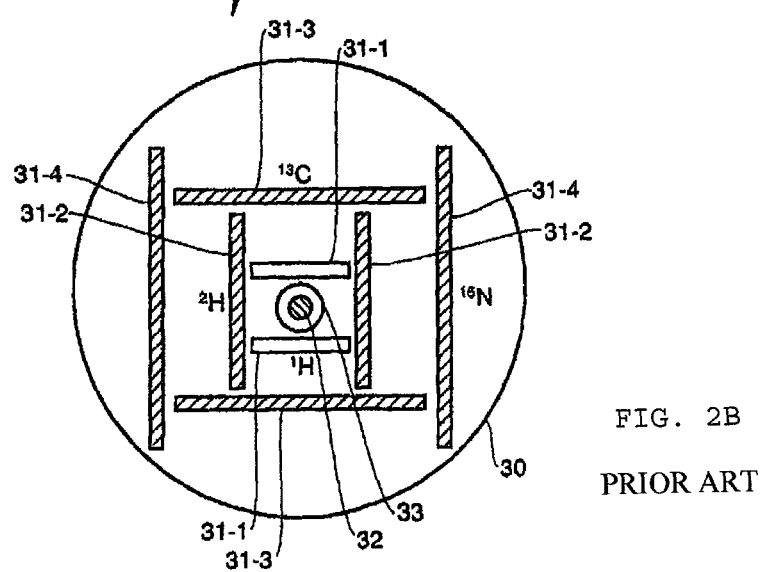

The preferred embodiments of the present invention are hereinafter described with reference to the drawings. An instrumental configuration that implements the present invention is the same as the instrumental configuration of the conventional NMR spectrometer shown in FIGS. 2A and 2B, the conventional NMR spectrometer being equipped with a cryogenic probe. In all of the figures including FIGS. 2A and 2B, identical components are indicated by identical reference numerals.

The present invention provides an NMR detection coil 31 achieving both high sensitivity and high resolution. Each coil element of the detection coil 31 is made of a superconducting material being a type II superconductor that is characterized in that it has a mixed state where a superconducting state and a normal state coexist. In the superconducting state, the magnetic field does not penetrate into the coil. In the normal state, the magnetic field in the form of magnetic flux penetrates into the coil.

The superconducting material needs to have lattice defects and normal precipitates. As described later, these lattice defects and normal conducting precipitates may be created or mixed intentionally. If they are created unintentionally during the manufacturing process, they may be utilized.

It can be considered that at lattice defects and in normal precipitates, the superconductivity is locally destroyed and normal state occurs. The magnetic properties of lattice defects and normal precipitates can be considered to be almost equivalent to magnetic flux in the mixed state. One difference of these lattice defects and normal precipitates with magnetic flux in a superconducting region is that these lattice defects and normal precipitates do not move through crystals. Another difference is that lattice defects and normal precipitates interact with crossing magnetic flux and trap the flux strongly. These lattice defects and normal precipitates are hereinafter referred to as the pinning centers.

Let Mp be the magnetization of the normal portions in the mixed state. Let Ms be the other magnetization of the superconducting portions in the mixed state. $H_0$ indicates a magnetic field to be set during an NMR measurement. $T_0$ is the set temperature of the coil. $T_0$ is the critical temperature of the superconductor. Note that the relation $T_0 < T_0$ holds.

A method consisting of three steps to reduce the total magnetization Mp+Ms of the superconducting material down to complete zero is described below.

(1) The external magnetic field is set to $H_0 + \Delta H$, where $\Delta H > 0$. It follows that when the detection coil made of a superconducting material is still in a normal conducting state, a magnetic field stronger than the ultimate target external magnetic field $H_0$ is applied to the detection coil (first step).

(2) The detection coil made of the superconducting material is cooled down to the set temperature $T_0$ that is below the critical temperature $T_0$. Consequently, the detection coil enters a superconducting state while the external magnetic field $H_0 + \Delta H$ is applied to the coil (step 2).

(3) The external magnetic field is lowered from $H_0 + \Delta H$ to $H_0$. Consequently, the applied external magnetic field decreases by $\Delta H$ while the detection coil is kept in the superconducting state (step 3).

During and after these three steps, the magnetization of the superconducting material varies in the manner described below.

First, when the step (2) ends, the magnetization of the superconducting material is Mp+Ms ($H_0 + \Delta H$). Ms ($H_0 + \Delta H$) that is a function of the external magnetic field assumes a negative value according to the Meissner effect. In particular, strong diamagnetic magnetization arises from shield currents are prevalent, the shield currents flowing through the skin layer that is substantially equal to the magnetic field penetration depth. As a property of the type II superconductor, magnetic flux penetrates into the detection coil in a superconducting state when the coil is in its mixed state, thus generating portions having the nature of paramagnetic magnetization Mp.

A case in which the external magnetic field is set to zero ($H_0 + \Delta E \rightarrow 0$) is now discussed. At this time, Ms ($H_0 + \Delta H$) is null. As the external magnetic field becomes null, shield currents no longer flow, and the diamagnetic magnetization vanishes. However, the magnetization Mp is kept trapped and remains. Today, this remaining property is extensively applied to superconducting magnets. Therefore, at zero magnetic field, the magnetization of the superconducting material is Mp and assumes a positive value. That is, during the process $H_0 + \Delta H \rightarrow 0$, the magnetization assumes a negative value at the beginning and a positive value at the end. Therefore, it can be expected that the total magnetization of the detection coil will assume a zero value at any intermediate strength value of the external magnetic field.

At the end of the step (3), the magnetization of the superconducting material is Mp+Ms ($H_0$). The features of the sign and value of this magnetization can be understood by taking notice of the following properties.

(a) Where the amount of variation of the magnetic field $\Delta H$ is small (<lower critical field $H_{c1}$), principally the shield currents flowing through the skin layer vary, the skin layer having a thickness substantially equal to the magnetic field penetration depth from the surface of the material. On the other hand, the behavior of the magnetic flux near the pinning center inside the skin layer of the superconductor is maintained. $H_{c1}$ indicates the lower critical magnetic field of the superconductor.

(b) When the amount of variation of the magnetic field $\Delta H$ is small, the magnetization Mp hardly varies before and after the magnetic field varies by $\Delta H$.

Because of the property (a), the magnetization Ms($H_0$) can be approximated by Ms($H_0 + \Delta H$)+$\chi \Delta H$. $\chi$ has a value equivalent to the absolute value of the magnetic field response coefficient (=perfectly diamagnetic susceptibility) below the lower critical field $H_{c1}$ when a magnetic field is first applied to the superconductor based on a zero-field cooling (ZFC) method. That is, it can be expected that the susceptibility $\chi$ is a large positive value of about +1.

A magnetization curve of a general type II superconductor is shown in FIG. 3. In the graph of FIG. 3, the horizontal axis indicates the strength of the magnetic field applied to a sample made of a type II superconductor. The vertical axis indicates the value of the magnetization of the type II superconductor.

As can be seen from the graph of FIG. 3, when the strength of the externally applied magnetic field is gradually increased from zero, the magnetization of the type II superconductor that is cooled into a superconducting state by the ZFC method assumes large negative values in an initial state (i.e., when the external magnetic field is 0 to $H_{c1}$). This is a feature of a perfectly diamagnetic material. The tilt of the curve is the diamagnetic susceptibility $-|\chi|$.

The value of the magnetization varies maximally in a region where the external magnetic field is below the lower critical field $H_{c1}$. When the external magnetic field is in the neighborhood of the lower critical field $H_{c1}$, a negative locally maximum value is shown. Thereafter, in spite of increases in the external magnetic field, the absolute value of the magnetization gradually decreases toward zero within the negative domain because of penetration of magnetic flux into the superconductor.

In this way, the graph of FIG. 3 suggests that when the magnetic field $\Delta H$ is approximately equal to the lower critical field $H_{c1}$, the relationship $|\chi \Delta H| > |Mp+Ms(H_0 \Delta H)|$ will hold. Eventually, at the end of the third step, if the magnetic field difference ΔH is set to below the lower critical field $H_{c1}$, it can be expected that the magnetization will assume a positive value. When the second step ends, the magnetization assumes a negative value. During the third step, the total magnetization will be brought to zero by adjusting the magnetic field difference ΔH to below the lower critical field $H_{c1}$.

In summary, the sequence of above three steps varies the magnetization of the superconducting material as described below.

(1) The total magnetization can be set to zero by using a type II superconducting material into which pinning centers have been mixed, by cooling with a FC method such that the material makes a phase transition into a superconducting state, and by lowering the external magnetic field. The amount by which the external magnetic field needs to be lowered is based on the lower critical field $H_{c1}$.

(2) The amount of magnetic field that needs to be secured when the external magnetic field is lowered by a given amount can be achieved by a range of magnetic field strengths capable of being produced by the external magnetic field shimming system installed in a general high-resolution NMR spectrometer. This is an important condition in practical applications. As an example, in a high temperature superconductor, the lower critical field $H_{c1}$ is so low as to be capable of producing a desirable result by the range of magnetic field that can be produced by the shimming system. For example, the lower critical field $H_{c1}$ of $YBa_2Cu_3O_7$ is approximately 30 Oe (oersteds) if the direction of the external magnetic field is selected to be perpendicular to the c-axis of growth of the sample.

(3) Supplementarily, the pinning centers are also effective in lowering the electrical resistance. Generally, it is considered that the thermal fluctuation of magnetic flux causes scattering the superconducting carriers. It is considered that introduction of the pinning centers facilitates trapping magnetic flux and reduces scattering of the superconducting carriers.

The configuration and operation are described below in further detail.

[Embodiment]
(1) Configuration
1. Detection Coil 31

The coil element is made of a type II superconducting material. Pinning centers formed by normal regions are introduced. One specific example of the superconducting material is a high temperature superconductor $YBa_2Cu_3O_7$ (Y123).

Amorphous non-superconducting columnar defects formed, for example, using heavy ion irradiation is advantageously used as pinning centers consisting of normal regions. The amount of the pinning centers is controlled according to the dose. Where the material Y123 is grown on a substrate, the amount is controlled by growing the material Y123 under the condition where the substrate has been disturbed by irradiating the substrate with heavy ions. Alternatively, the amount may be controlled by irradiating grown material Y123 with heavy ions so as to form crystal defects.

For instance, during growth of Y123, if non-superconducting domain such as $Y_2BaCuO_5$ (Y211) is introduced, pinning centers consisting of normal conducting regions are created effectively. The amount of pinning centers is controlled by controlling the growth environment (such as temperature and oxygen gas pressure).

introducing non-superconducting phase particles such as $BaZrO_3$ or $BaSnO_3$ is an effective method of forming pinning centers consisting of normal conducting regions.

Furthermore, forming scratches on the substrate is an effective method of forming pinning centers consisting of normal conducting regions. In addition, during the growth process, means for forming various defects (such as incorporation of grain boundaries and adjustment of the oxygen concentration) may be utilized effectively.

Another example of the material is a high temperature superconductor $Bi_2Sr_2CaCu_2O_8$. In the same way as the foregoing, formation of pinning centers consisting of normal conducting regions can be effectively used by heavy ion irradiation or RE211 phase formation.

A further example of the material is a metallic low-temperature superconductor NbTi. It is conceivable that pinning centers consisting of normal regions are formed by α-Ti phase on grain boundaries.

2. Shim Coil Set 23 and Power Supply for Controlling it

It is an object of these components to produce a magnetic field of approximately $H_{c1}$ (about 100 Oe) parallel to the external magnetic field of about 100 kOe (kiloOersteds) developed by the superconducting magnet system 21. For example, where Y123 is selected as the material of the detection coil 31, it is required to produce a lower critical field $H_a$ of about 30 Oe in the Z-direction (along the static magnetic field).

3. Probe Cooling System 24

It is an object of this cooling system to cool the detection coil 31 incorporated in the probe 22 down to a cryogenic region.

(2) Operation

The sequence of steps of the present embodiment is illustrated in the following Table, which depicts the following six steps in order.

Table

1. First Step [A001]

The temperature of the detection coil is set to above the critical temperature $T_0$. The external magnetic field $H_0$ is produced from the superconducting magnet system 21. The external magnetic field ΔH is produced from the shim coil set in the Z-axis direction parallel to the external field $H_0$. Thus, the detection coil is magnetized paramagnetically.

2. Second Step [A002]

The detection coil 31 is cooled to the set temperature $T_0$ ($<T_c$) that is lower than the critical temperature $T_c$ by the probe cooling system 24 to bring the coil into a superconducting state.

3. Third Step [A003]

The homogeneity of the static magnetic field around the sample is recorded from the results of measurements of the line widths of NMR spectra, using a reference standard for NMR, the reference standard permitting one to know the magnetic field homogeneity of the sample from line widths.

4. Fourth Step [A004]

The external magnetic field ΔH produced by the shim coil set 23 in the Z-axis direction (in the same direction as $H_0$) is lowered. The magnetic field homogeneity (i.e., the observed NMR line width of the NMR reference standard) is recorded and compared with the previous recording.

5. Fifth Step [A005]

By repeating the steps A003-A004, the external magnetic field ΔH is adjusted to maximize the static magnetic field homogeneity (i.e., the observed NMR line width of the NMR reference standard is minimized). This operation is exactly identical in processing sequence with normally conducted works for adjusting the Z shims

6. Sixth Step [A006]

High-sensitivity NMR measurements are made using the detection coil that has been set up such that the magnetization value is zero in this way.

Figure 4:
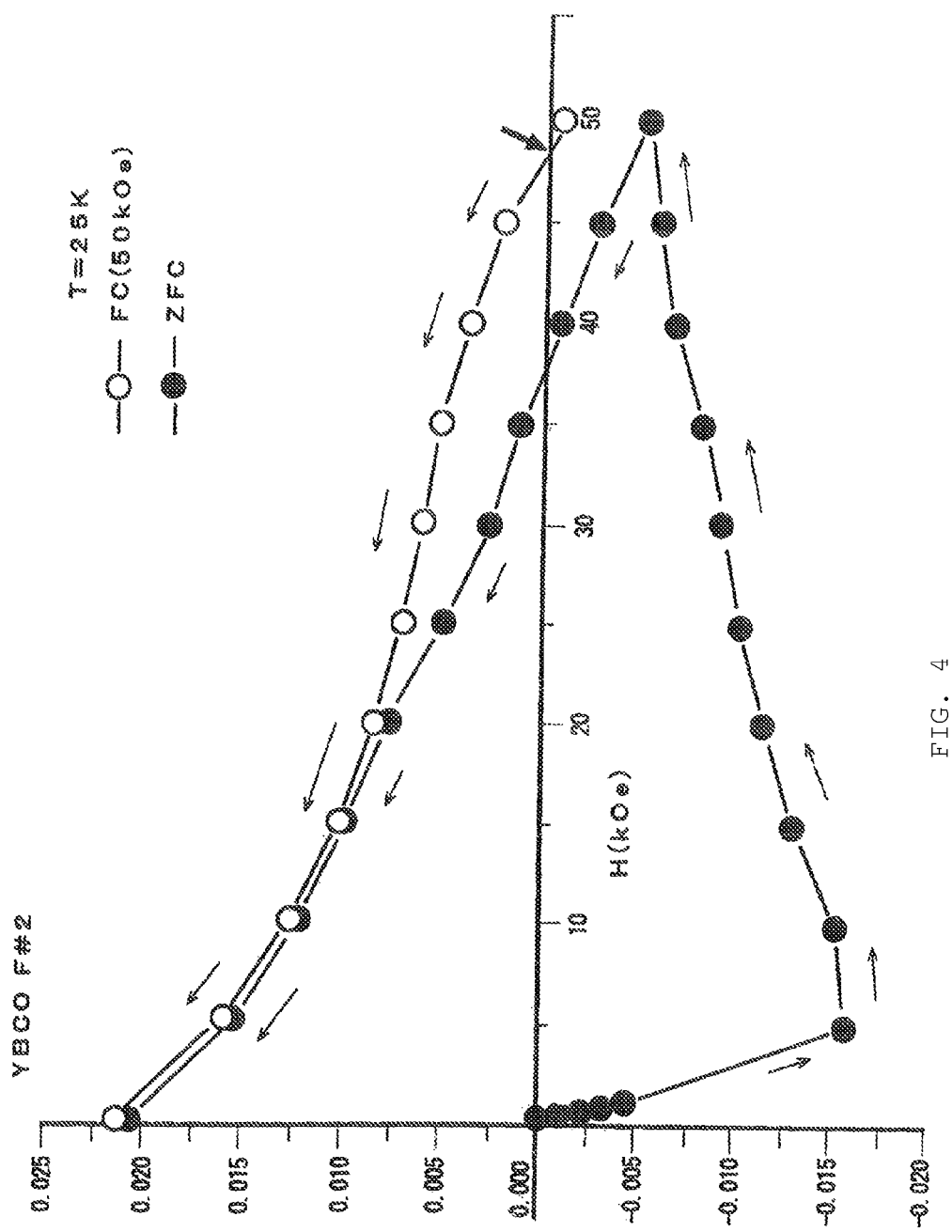
FIG. 4 is a graph showing examples of magnetization curve of sample Y123 obtained by measurements.

Preferably, data about a magnetization curve as shown in FIG. 4 is obtained at the temperature $T_0$ from the detection coil 31 prior to execution of the above-described sequence of operations. If the relationship between the external magnetic field and the magnetization at the desired set magnetic field $H_0$ and at magnetic fields lower than the set field is recorded, guidelines are provided on how to set the external magnetic field $\Delta H$ at the first step A001.

At this time, when the external magnetic field is weakened, the magnetization does not vary from a negative value to a positive value and thus the zero level of magnetization is not crossed, the detection coil 31 is so operated as to increase the amount of pinning centers within the coil 31. Consequently, the magnetic field opposite in sense to the static magnetic field produced on the surface of the detection coil 31 by the Meissner effect can be completely canceled out by a magnetic field of a positive sense produced by holding of the outer magnetic flux owing to the pinning effect inside the coil 31. As a result, the total magnetization over the detection coil 31 can be made complete zero.

FIG. 4 shows the results of measurements of a magnetization curve of a sample of Y123. The measurements were made using a SQUID magnetometer. In the graph of FIG. 4, the horizontal axis indicates the strength of the magnetic field applied to the sample. The vertical axis indicates the value of the magnetization. The sample was placed in such a way that $H_0$ was perpendicular to the c-axis along which a thin film of Y123 was grown.

The small black circles (●) are plots of the magnetization of the sample, showing how the magnetization varied in a case where the sample was brought into a superconducting state by a ZFC (zero-field cooling) method, then the external magnetic field was gradually increased from zero to 50 kOe, and then the magnetization was gradually lowered from 50 kOe to zero.

The small white circles (○) are plots of the magnetization of the sample, showing how the magnetization varied in a case where an external static magnetic field of 50 kOe was applied, then the sample was cooled into a superconducting state by a field cooling (FC) method, and the external magnetic field was gradually lowered from 50 kOe to zero.

As can be seen from the graph of FIG. 4, the magnetization of the type II superconductor made superconductive by the zero-field cooling showed large negative values in an initial state (i.e., when the external magnetic field was varied from 0 to $H_{cl}$) when the strength of the externally applied static field was gradually increased from zero. That is, a feature of a perfectly diamagnetic material is exhibited. The tilt of the curve is the diamagnetic susceptibility $-|\chi|$.

However, after the magnetization showed its negative locally maximum value around a point at which the external magnetic field assumed its lower critical field $H_{cl}$, the absolute value of the magnetization gradually decreased toward zero in the negative domain because of penetration of magnetic flux into normal conducting portions generated by normal conducting precipitates and lattice defects within the superconductor in spite of increases in the external magnetic field.

On the other hand, the magnetization of the type II superconductor made superconductive by cooling done by an FC method showed negative values much smaller than values obtained using the ZFC method at the initial value of 50 We because positive magnetization caused by the pinning effects and negative magnetization caused by the Meissner effect canceled out each other.

If the external magnetic field is slightly lowered, the sample assumes a zero-magnetization state. Then, if the external magnetic field is lowered down to zero, the magnetization of the sample gradually increases in the positive domain. The magnetization assumes a positive maximum value at zero magnetic field. The value occurring at this time is substantially equal to the final value measured using the ZFC method.

In the ZFC method, the Meissner effect produces an active magnetic shielding effect when the external magnetic field is increased from zero field. Consequently, the magnetic field does not easily penetrate into the bulk of the sample. This reduces the probability at which magnetic flux crosses pinning centers and so magnetic flux is not easily trapped in the pinning centers. In this case, the magnetic flux vanishes when the external magnetic field is lowered from the maximum magnetic field reachable Hmax (50 kOe in FIG. 4).

On the other hand, in the FC method, just as the material makes a transition to a superconducting state, the pinning centers inside the sample sufficiently act to trap magnetic flux because the magnetic flux penetrates into the bulk of the sample. As a result, also when the external magnetic field is lowered from the maximum magnetic field reachable Hmax (50 kOe in FIG. 4), magnetic flux is trapped and does not easily vanish.

In the above-described embodiment, the shim coil set 23 (especially, the Z-shim coil) and the power supply for controlling the coil set are used as a source of magnetic field for previously increasing the external magnetic field slightly ($\Delta H$). As described previously, many superconducting magnet systems for high-resolution NMR spectrometers are equipped with a shimming function. This shimming function can be employed for this purpose, thus yielding an advantage. Zero-magnetization state of the NMR detection coil is accomplished by making the coil superconductive by an FC method and then slightly lowering the external magnetic field by the small amount ($\Delta H$) using the Z-shim coil.

However, depending on the value of the lower critical field $H_{cl}$ of the superconducting material, the amount of magnetic field required might be insufficient if only the shim coil set 23 and control power supply for it are used. In this case, it is necessary to mount a separate coil producing a variable magnetic field of high homogeneity or to manipulate the current through the superconducting magnet system 21.

In U.S. Pat. No. 5,986,453, written by Anderson et al., a method of generating and annihilating magnetic flux by making use of an AC magnetic field is proposed. In this case, however, irreversible variation of the magnetization is indispensable. Consequently, the magnetic field must be increased and decreased over a relatively wide range.

A method of setting the total magnetization of the detection coil to zero state using a small magnetic field decrease below the lower critical field $H_{cl}$ has been described herein. This method can be easily implemented with actual configurations because a magnet system for a high-resolution NMR spectrometer is usually equipped with a magnetic field shimming system. The method can be implemented by the field adjusting function of this shimming system.

In conclusion, suppression of the magnetization of a superconducting material can be accomplished, based on the assumption that a superconductor having a small electrical resistance and permitting detection sensitivity improvement is used as the material of an NMR detection coil, by selecting a type II superconductor having pinning centers (normal conducting regions) capable of strongly trapping magnetic flux, selecting a field-cooling method providing a high probability of trapping magnetic flux by the pinning centers (normal conducting regions) under a superconducting state, and only performing a simple operation for lowering the magnetic field at a given cryogenic temperature. Furthermore, the magnetization can be suppressed only with a small amount of magnetic field decrease.

The present invention can be widely applied to cryogenic probes for use in high-sensitivity NMR spectrometers.

Having thus described our invention with the detail and particularity required by the Patent Laws, what is desired protected by Letters Patent is set forth in the following claims.

The invention claimed is:

1. A method of setting up an NMR spectrometer having: a superconducting magnet system for applying a static magnetic field $H_0$ to a sample; an NMR probe for magnetically exciting nuclei under investigation by applying an RF magnetic field to the sample in a direction perpendicular to the static magnetic field $H_0$; a detection coil made of a superconducting material, incorporated in the NMR probe, and detecting an NMR signal emanating from the magnetically excited nuclei under investigation; and a cryogenic cooling system for cryogenically cooling the detection coil, enhancing the Q value of the coil, and reducing thermal noise, said method comprising the steps of:
(1) setting an external magnetic field to $H_0+\Delta H$ (where $\Delta H>0$) and applying a magnetic field stronger than the ultimate target external static magnetic field strength $H_0$ by $\Delta H$ to the detection coil when the detection coil made of the superconducting material is set to above the critical temperature $T_c$;
(2) cooling the detection coil made of the superconducting material down to $T_0$ lower than its critical temperature $T_c$ to bring the coil into a superconducting state while the external magnetic field $H_0+\Delta H$ is applied to the detection coil; and
(3) lowering the external magnetic field from $H_0+\Delta H$ to $H_0$ such that the applied external magnetic field is decreased by $\Delta H$ while the detection coil is kept in the superconducting state.

2. A method of setting up an NMR spectrometer as set forth in claim 1, wherein a shim coil set and a power supply for controlling the shim coil set are used to generate said magnetic field $\Delta H$.

3. A method of setting up an NMR spectrometer as set forth in claim 2, wherein the external magnetic field is matched to an optimum value for making magnetization of the detection coil zero by measuring an NMR signal emanating from a reference standard while varying the magnetic field $\Delta H$ generated by the shim coil set and adjusting shim values of the shim coil set so as to minimize the signal in terms of line width.

4. A method of setting up an NMR spectrometer as set forth in claim 1, wherein said superconducting material is a type II superconductor.

5. A method of setting up an NMR spectrometer as set forth in claim 4, wherein said type II superconductor is one selected from a high temperature superconductor $YBa_2Cu_3O_7$, a high temperature superconductor $Bi_2Sr_2CaCu_2O_8$, and a metallic low-temperature superconductor NbTi.

6. A method of setting up an NMR spectrometer as set forth in any one of claims 4 and 5, wherein characteristics of said type. II superconductor are controlled by presence of an amorphous non-superconducting columnar defects formed by heavy ion irradiation, normal conducting impurities, or lattice defects.

7. A method of setting up an NMR spectrometer as set forth in claim 1, wherein in order to estimate an optimum value of the magnetic field $\Delta H$, a magnetization curve is previously found using a magnetization measuring device and by field cooling of the superconducting material.

8. A method of setting up an NMR spectrometer as set forth in claim 7, wherein said magnetization measuring device is a SQUID magnetometer.

9. An NMR spectrometer comprising:
a superconducting magnet system for applying a static magnetic field $H_0$ to a sample;
an NMR probe for magnetically exciting nuclei under investigation by applying an RF magnetic field to the sample in a direction perpendicular to the static magnetic field $H_0$;
a detection coil made of a superconducting material, incorporated in the NMR probe, and detecting an NMR signal emanating from the magnetically excited nuclei under investigation;
a cryogenic cooling system for cryogenically cooling the detection coil, enhancing the Q value of the coil, and reducing thermal noise; and
setup means for setting up the spectrometer by performing the following steps:
(1) setting an external magnetic field to $H_0+\Delta H$ (where $\Delta H>0$) and applying a magnetic field stronger than the ultimate target static magnetic field strength $H_0$ by $\Delta H$ to the detection coil when the detection coil made of the superconducting material is set to above the critical temperature $T_c$;
(2) cooling the detection coil made of the superconducting material down to $T_0$ lower than its critical temperature $T_c$ to bring the coil into a superconducting state while the external magnetic field $H_0+\Delta H$ is applied to the detection coil; and
(3) lowering the external magnetic field from $H_0+\Delta H$ to $H_0$ such that the applied external magnetic field is decreased by $\Delta H$ while the detection coil is kept in the superconducting state.

* * * * *

UNITED STATES PATENT AND TRADEMARK OFFICE
CERTIFICATE OF CORRECTION

PATENT NO. : 9,494,663 B2
APPLICATION NO. : 13/732582
DATED : November 15, 2016
INVENTOR(S) : Shigenori Tsuji et al.

Page 1 of 1

It is certified that error appears in the above-identified patent and that said Letters Patent is hereby corrected as shown below:

On the Title Page

Column 2, Item (57) Abstract, delete "4H>0)." and insert -- $\Delta H>0$). --

In the Claims

Column 14, Line 12, delete "type." and insert -- type --

Signed and Sealed this
Twenty-eighth Day of March, 2017

Michelle K. Lee
*Director of the United States Patent and Trademark Office*